(12) United States Patent
Agarwal

(10) Patent No.: US 6,570,204 B1
(45) Date of Patent: May 27, 2003

(54) INTEGRATED CIRCUITRY AND DRAM CIRCUITRY

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 09/654,297

(22) Filed: Sep. 1, 2000

Related U.S. Application Data

(62) Division of application No. 09/323,440, filed on Jun. 1, 1999.

(51) Int. Cl.[7] .................. H01L 27/108; H01L 29/76; H01L 29/94; H01L 31/119
(52) U.S. Cl. .................. 257/296; 257/300; 257/305
(58) Field of Search .................. 257/296, 300, 257/305, 290

(56) References Cited

U.S. PATENT DOCUMENTS

| | | | |
|---|---|---|---|
| 5,194,753 A | 3/1993 | Rhodes et al. .................. 257/775 |
| 5,262,343 A | 11/1993 | Rhodes et al. .................. 437/52 |
| 5,793,076 A | 8/1998 | Fazan et al. .................. 257/298 |
| 5,940,676 A | 8/1999 | Fazan et al. .................. 438/3 |
| 5,998,256 A | 12/1999 | Juengling .................. 438/253 |
| 6,064,589 A | 5/2000 | Walker .................. 365/149 |
| 6,124,626 A | 9/2000 | Sandhu et al. .................. 257/532 |
| 6,136,646 A | 10/2000 | Linliu et al. .................. 438/255 |
| 6,175,130 B1 * | 1/2001 | Hosotani et al. .................. 257/301 |
| 6,215,646 B1 * | 4/2001 | Ochiai et al. .................. 257/301 |
| 6,303,429 B1 * | 10/2001 | Ishibashi et al. .................. 438/243 |

* cited by examiner

*Primary Examiner*—Amir Zarabian
*Assistant Examiner*—Kiesha Rose
(74) *Attorney, Agent, or Firm*—Wells St. John P.S.

(57) ABSTRACT

A method of forming a pair of capacitors having a common capacitor electrode includes forming a pair of spaced first capacitor electrodes within insulating material. The first electrodes have uppermost surfaces which are below an uppermost surface of the insulating material. Some of the insulating material is removed about the first capacitor electrodes and a path is provided within the insulating material lower than its uppermost surface between the spaced first electrodes. A capacitor dielectric layer is formed over the first capacitor electrodes. A second capacitor electrode layer is formed over the capacitor dielectric layer common to the spaced first capacitor electrodes and within the path. A method of forming DRAM circuitry includes forming an array of capacitor storage node electrodes over a substrate. A capacitor cell plate pattern is formed over the substrate. Conductive material is deposited over the substrate and into the capacitor cell plate pattern. The conductive material is polished outwardly of the pattern. In one implementation, a capacitor dielectric layer and a common cell plate layer are formed over the capacitor storage node electrodes. The cell plate layer is polished to form bit contact regions therethrough. Integrated circuitry formed by these and other methods is claimed.

6 Claims, 13 Drawing Sheets

INTEGRATED CIRCUITRY AND DRAM CIRCUITRY

RELATED PATENT DATA

This patent resulted from a divisional application of U.S. patent application Ser. No. 09/323,440, filed Jun. 1, 1999, entitled "Method of Forming a Pair of Capacitors Having a Common Capacitor Electrode, Method of Forming DRAM Circuitry, Integrated Circuitry, and DRAM Circuitry", naming Vishnu K. Agarwal. as inventor, the disclosure of which is incorporated by reference.

TECHNICAL FIELD

This invention relates to methods of forming a pair of capacitors having a common capacitor electrode, to methods of forming DRAM circuitry, to integrated circuitry and to DRAM circuitry.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants. Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials, such as ferroelectric materials or perovskite material or pentoxides such as tantalum pentoxide, have high dielectric constants and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Preferred materials for the conductive capacitor electrodes when using these high k dielectric materials are Pt, Rh, Ru, Ir, and conductive oxides of these materials. Such materials are resistant to formation of insulative oxides which can otherwise undesirably form when many other conductive materials come in contact with, or during the processing to form, the high k dielectric materials.

In one type of DRAM circuitry, bit line contacts are made after formation of the array capacitors. In such event, provision is typically made to form bit contacts which extend through a capacitor cell plate layer without causing bit line to cell plate shorts. One way of accomplishing this objective is to first etch away regions of the cell plate layer and the capacitor dielectric layer where bit contacts will extend in a spaced manner through the cell plate layer. Subsequently, bit contact openings are etched in insulating material through these regions to lower substrate material. Subsequently, the bit contacts are filled with conductive material, and bit lines are ultimately formed. The high k capacitor dielectric materials and the conductive materials utilized therewith can be difficult materials to etch. Accordingly, etching conducted through the cell plate layer when utilizing such materials may not be complete, and undesirably leave material which effectively produces bit line to cell plate shorts.

The invention was principally motivated in addressing this particular problem, although the artisan will appreciate applicability of the invention in any other areas where pairs of capacitors are formed adjacent one another, and share a common capacitor plate.

SUMMARY

This invention comprises a method of forming a pair of capacitors having a common capacitor electrode, a method of forming DRAM circuitry, and integrated circuitry and DRAM circuitry. In one implementation, a method of forming a pair of capacitors having a common capacitor electrode includes forming a pair of spaced first capacitor electrodes within insulating material. The first electrodes have uppermost surfaces which are below an uppermost surface of the insulating material. Some of the insulating material is removed about the first capacitor electrodes and a path is provided within the insulating material lower than its uppermost surface between the spaced first electrodes. A capacitor dielectric layer is formed over the first capacitor electrodes. A second capacitor electrode layer is formed over the capacitor dielectric layer common to the spaced first capacitor electrodes and within the path.

In one implementation, a method of forming DRAM circuitry includes forming an array of capacitor storage node electrodes over a substrate. A capacitor cell plate pattern is formed over the substrate. Conductive material is deposited over the substrate and into the capacitor cell plate pattern. The conductive material is polished outwardly of the pattern. In one implementation, a capacitor dielectric layer and a common cell plate layer are formed over the capacitor storage node electrodes. The cell plate layer is polished to form bit contact regions therethrough.

In one implementation, integrated circuitry comprises a pair of adjacent capacitors received within an insulative mass. The insulative mass having an outermost substantially planar surface extending at least partially between the adjacent capacitors. The capacitors respectively comprise a first capacitor electrode and a second capacitor electrode common to the pair. The second capacitor electrode has an outermost surface between the first capacitor electrodes which is elevationally coincident with or elevationally inward of the outermost substantially planar surface of the insulative mass. In one implementation, exemplary circuitry comprises DRAM.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
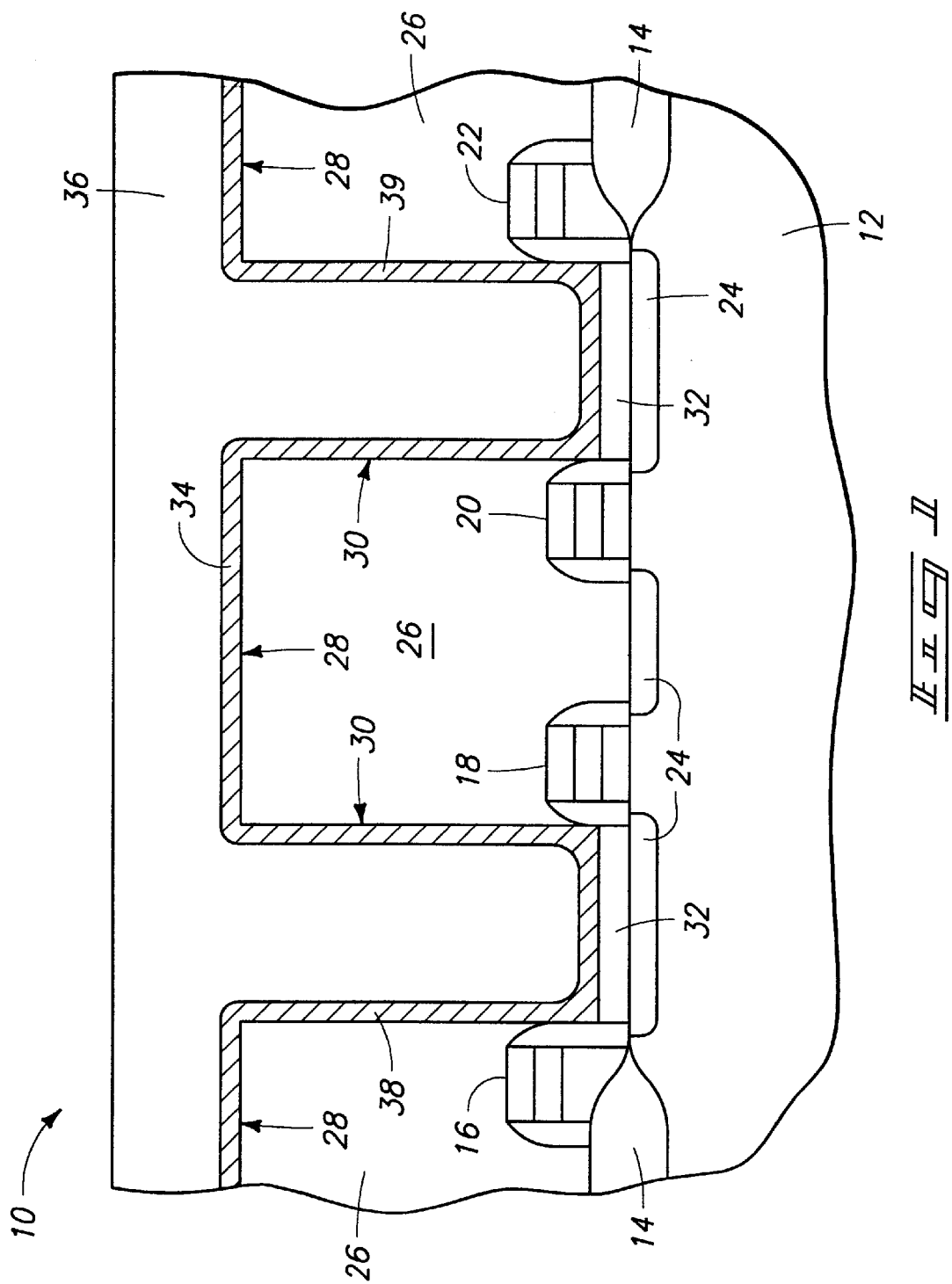
FIG. 1 is a diagrammatic sectional view of a semiconductor wafer fragment in process in the formation of example DRAM circuitry in accordance with an aspect of the invention.

The invention contemplates integrated circuitry comprising a pair of adjacent capacitors sharing a common electrode, and the fabrication thereof. The preferred and described embodiment is with respect to DRAM circuitry fabrication, and more preferably to the fabrication of bit line over capacitor DRAM circuitry. Referring to FIG. 1, a semiconductor wafer fragment in process is indicated generally with reference numeral 10. Such comprises a bulk monocrystalline silicon substrate 12. In the context of this document, "semiconductive substrate" or "semiconductor substrate " is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation oxide 14 has been formed relative to substrate 12, with an array of DRAM word lines 16, 18, 20 and 22 being fabricated over substrate 12. In this particular example, the array comprises respective pairs of word lines for formation of respective pairs of DRAM memory cells which share a common bit line contact, with word lines 18 and 20 constituting one such pair in the illustrated section. The bit line contact in this example will be formed between word lines 18 and 20, with the storage capacitors being formed immediately laterally outwardly thereof, as is conventional in the art. Conductive source/drain diffusion regions 24 are formed within bulk substrate 12. An insulative mass or material 26 is formed over DRAM word line 16, 18, 20 and 22, with doped oxide such as borophosphosilicate glass (BPSG) being an example material. Insulative mass 26 has been planarized back to produce a substantially planar outer surface 28, such as by chemical-mechanical polishing (CMP) within the array. Openings 30 have been formed in BPSG layer 26, with polysilicon plugs 32 having been formed at the lowermost portions thereof. Insulating material 26 might constitute one or more deposited layers, with polysilicon plugs 32 possibility having been fabricated prior to formation of openings 30.

A first capacitor electrode layer 34 is deposited to partially fill or line openings 30. Preferred materials for layer 34 are Pt, Rh, Ru, Ir, conductive oxides of these materials, and mixtures thereof. A layer 36 has been formed over layer 34, and to completely fill remaining volume of openings 30. Layer 36 preferably comprises a polymer film, for example polyimide or photoresist, which is resistant to an etch chemistry which will be used to recess electrodes 38 and 39 which are identified below.

Figure 2:
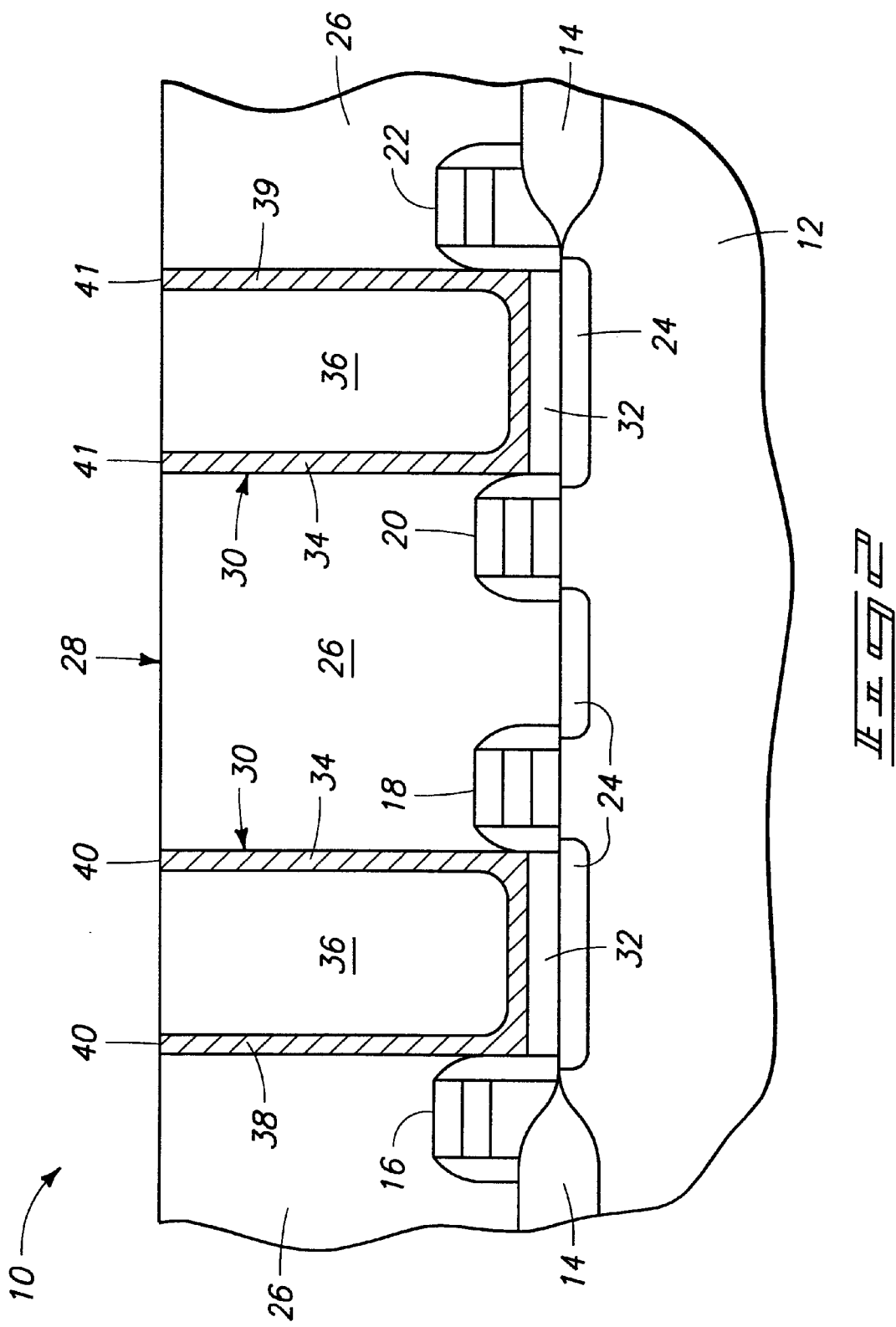
FIG. 2 is a view of the FIG. 1 wafer fragment at a processing step subsequent to that shown by FIG. 1.

Referring to FIG. 2, layers 36 and 34 have been planarized back at least to and preferably slightly into layer 26, with CMP being one example polishing method. Layer 36 is preferably provided in advance of such polish to keep the slurry from becoming lodged within the remaining container volume which is difficult to remove by cleaning, and is conventional in the art. Remaining portions of layer 34 within openings 30 will constitute at least in part first capacitor electrodes, in this example DRAM storage node electrodes, which are at least partially received within an insulative mass 26 in an array of such capacitors in the DRAM circuitry being formed. Thus, such provides but one example process of forming a pair of spaced container-shaped first capacitor electrodes 38 and 39 within insulating material 26 over a substrate. Insulating material 26 has an outermost surface 28 which is planar at least proximate container electrodes 38 and 39, and in the illustrated example is planar everywhere between such container electrodes. Container electrodes 38 and 39 have uppermost surfaces 40 and 41, respectively.

Figure 3:
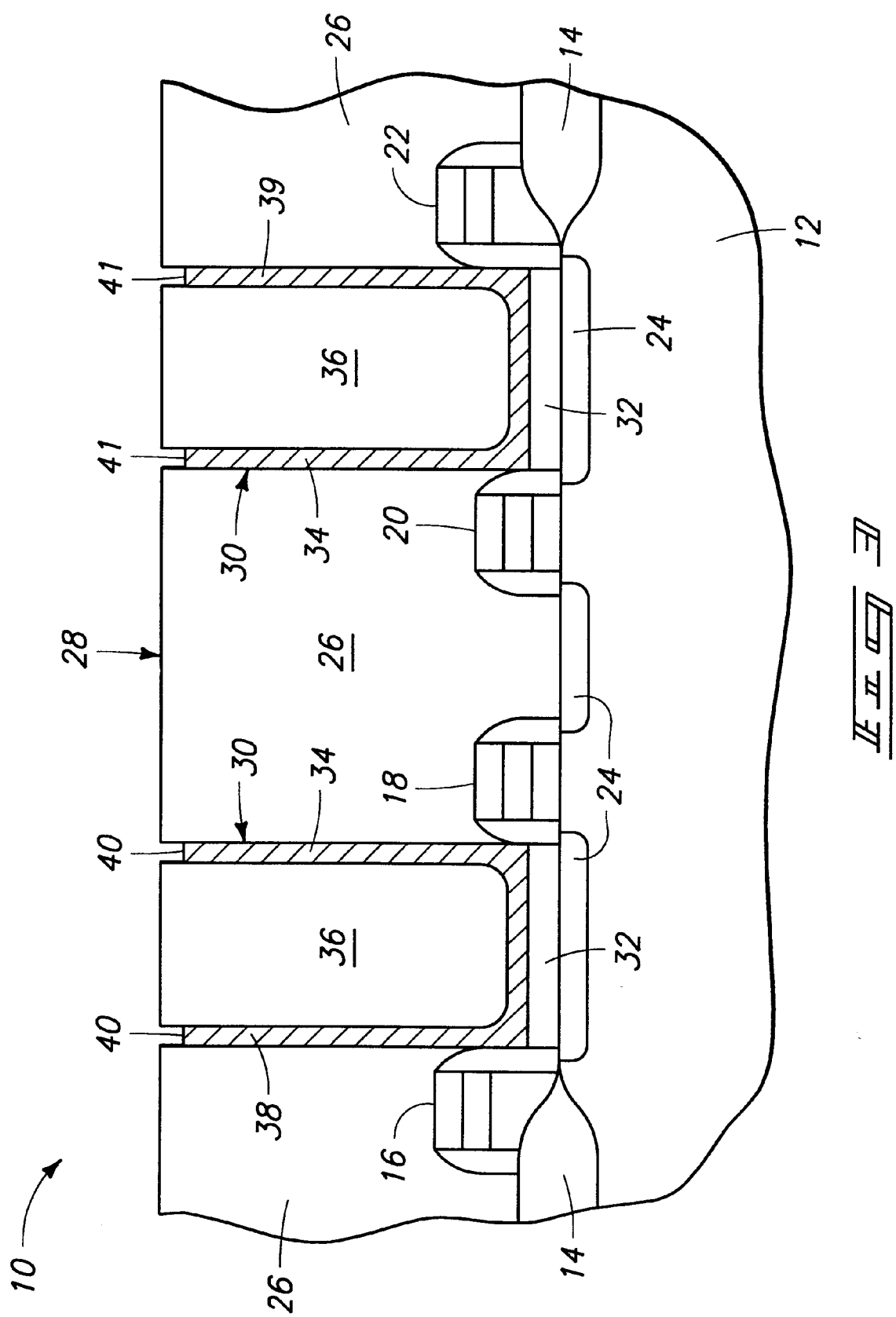
FIG. 3 is a view of the FIG. 1 wafer fragment at a processing step subsequent to that shown by FIG. 2.

Referring to FIG. 3, outermost portions of container electrodes 38 and 39 have been etched back to recess their outermost surfaces 40 and 41 inwardly of substantially planar outermost surface 28 of insulating material 26. The depth of the etch is preferably conducted to be slightly larger than an over-etch or over-polish tolerance with respect to a subsequent processing step, which will become more clear from the following discussion. An example depth for the recess etch is 200 Angstroms. Where for example layer 34 constitutes platinum, an example process for producing the etch illustrated by FIG. 3 comprises a mixture of $HNO_3$ and HCl. Such provides but one example of forming first electrodes 38 and 39 to have uppermost surfaces 40 and 41 which are below uppermost surface 28 of insulating material 26. Other removal techniques are also of course contemplated.

Figure 4:
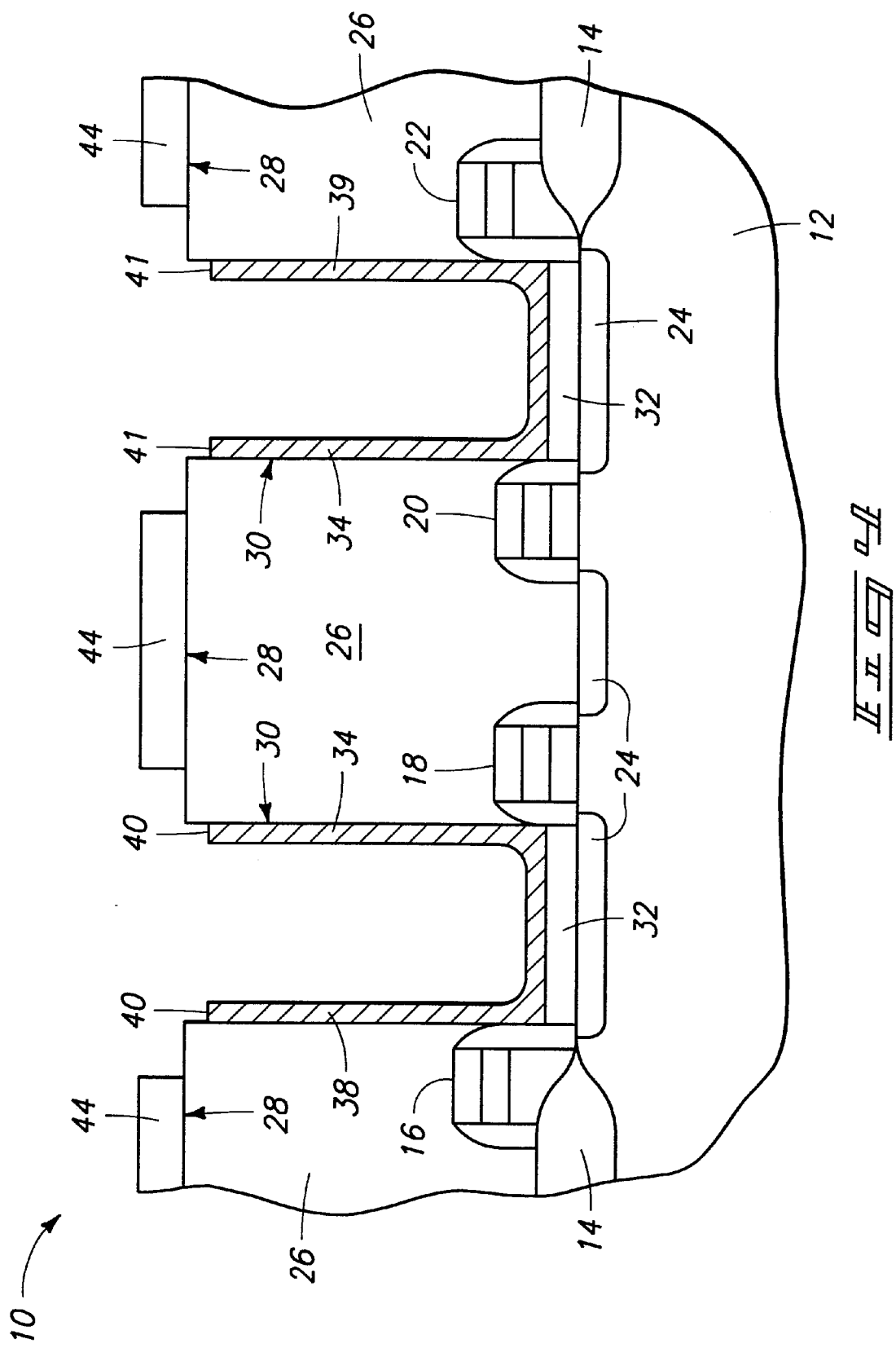
FIG. 4 is a view of the FIG. 1 wafer fragment at a processing step subsequent to that shown by FIG. 3.

Referring to FIG. 4, remaining layer 36 has been stripped and a photoresist or other masking layer 44 has been deposited and patterned as shown. Such results in masking only a portion of the insulating material between spaced container electrodes 38 and 39, and leaves the container electrodes and at least some insulating material there adjacent outwardly exposed or unmasked. In the preferred embodiment, the patterning of photoresist layer 44 is conducted to substitute for the same prior art patterning in fabrication of DRAM circuitry of the cell plate layer pattern. Such patterning is typically conducted to both provide bit contact regions through the cell plate layer, and to pattern the cell plate layer peripheral to the array for desired interconnection or other line formation thereof.

Figure 5:
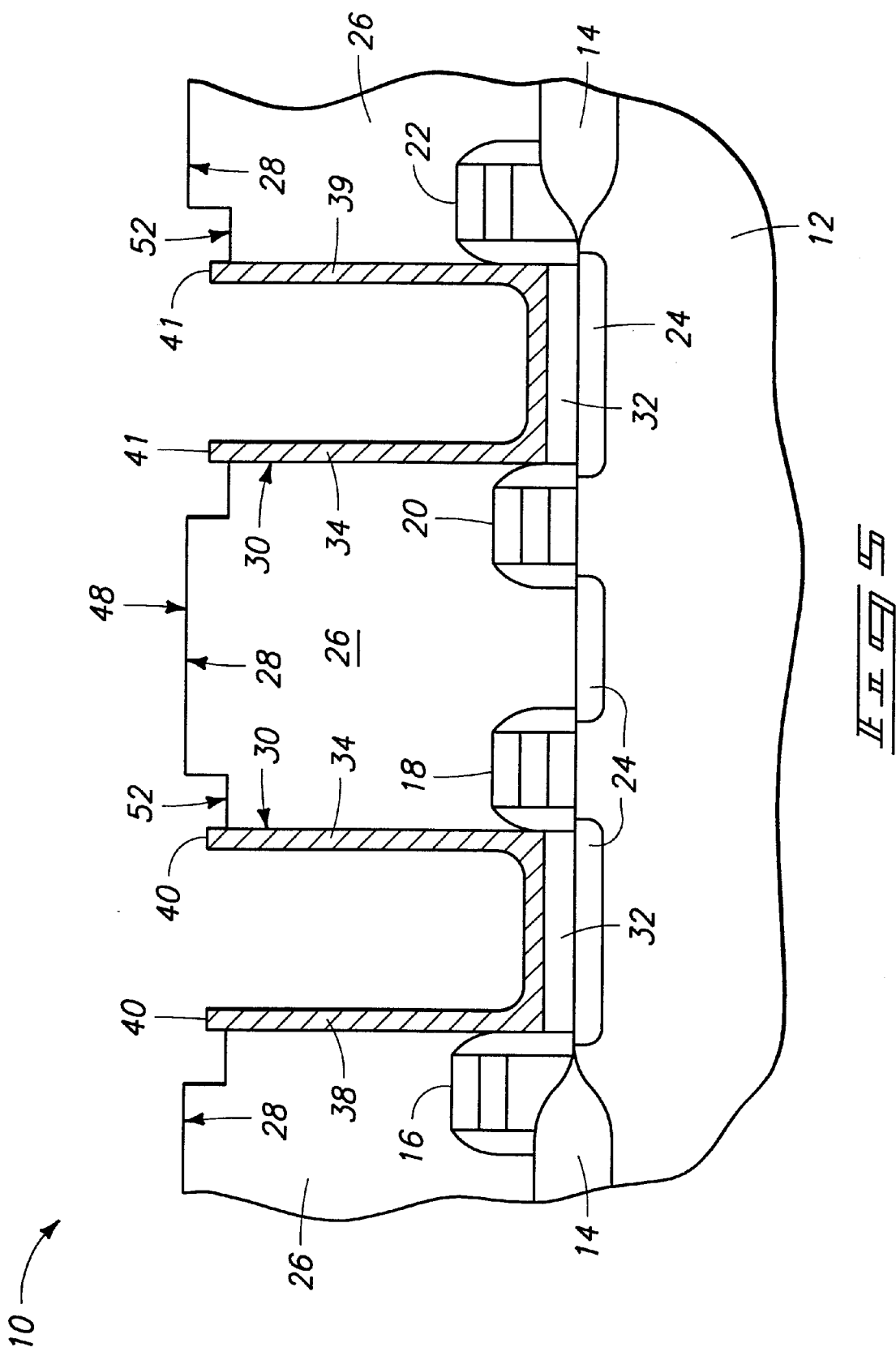
FIG. 5 is a view of the FIG. 1 wafer fragment at a processing step subsequent to that shown by FIG. 4.
Figure 6:
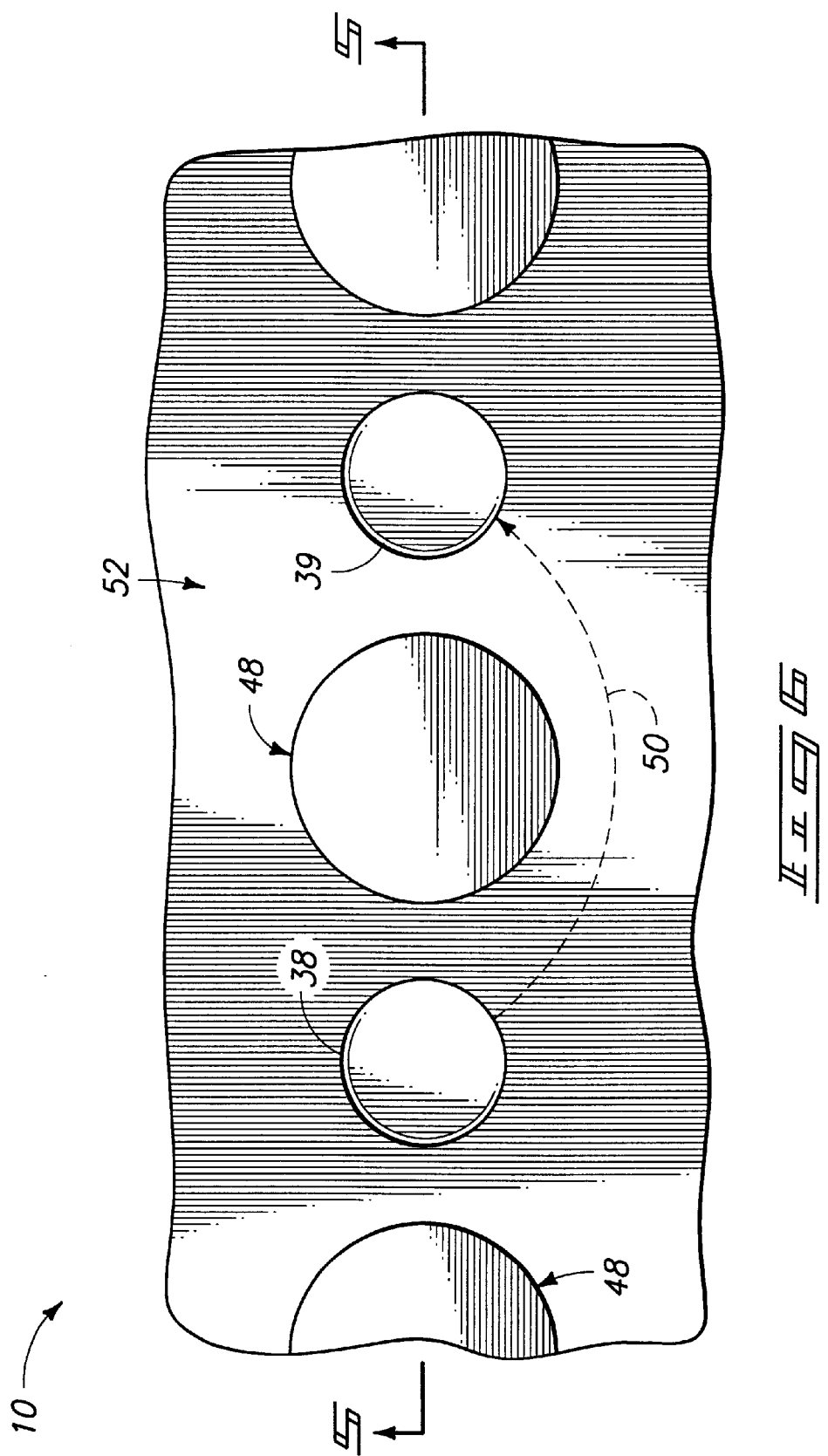
FIG. 6 is a top plan view of a portion of the FIG. 1 wafer fragment as depicted in FIG. 5.

Referring to FIGS. 5 and 6, some of insulating material 26 is removed about first capacitor electrodes 38 and 39. Such is preferably accomplished by conducting a timed etch of layer 26 such that unmasked portions of the insulating material are etched inwardly at least to outermost surfaces 40 and 41 of recessed container electrodes 38 and 39. More preferably, the removal is conducted to a point below such outermost surfaces to expose at least a portion of the outermost sidewall surfaces of containers 38 and 39, as is shown. A preferred etch comprises a dry etch utilizing, for example, $CHF_3$ or $CF_4$ gas mixtures in plasma typically use to etch BPSG and other oxides. Accordingly in the preferred embodiment, at least some of a substantially planar outermost surface will remain between electrodes 38 and 39, in this example producing the illustrated mesa 48 therebetween. FIG. 5 is a section view taken through line 5—5 as shown in FIG. 6. Thus, some path 50 (FIG. 6) is provided within insulating material 26 lower than its uppermost surface 28 between spaced container-shaped electrodes 38 and 39.

Thus in this particular preferred embodiment, the etching of material 26 and subsequent removal of photoresist layer 44 produces a capacitor cell plate pattern over the substrate, with in this example the pattern being formed in insulative material. The pattern has a floor 52 in this example which is at least partially received elevationally lower than outermost surfaces 40, 41, of capacitor storage node electrodes 38, 39, respectively.

Figure 7:
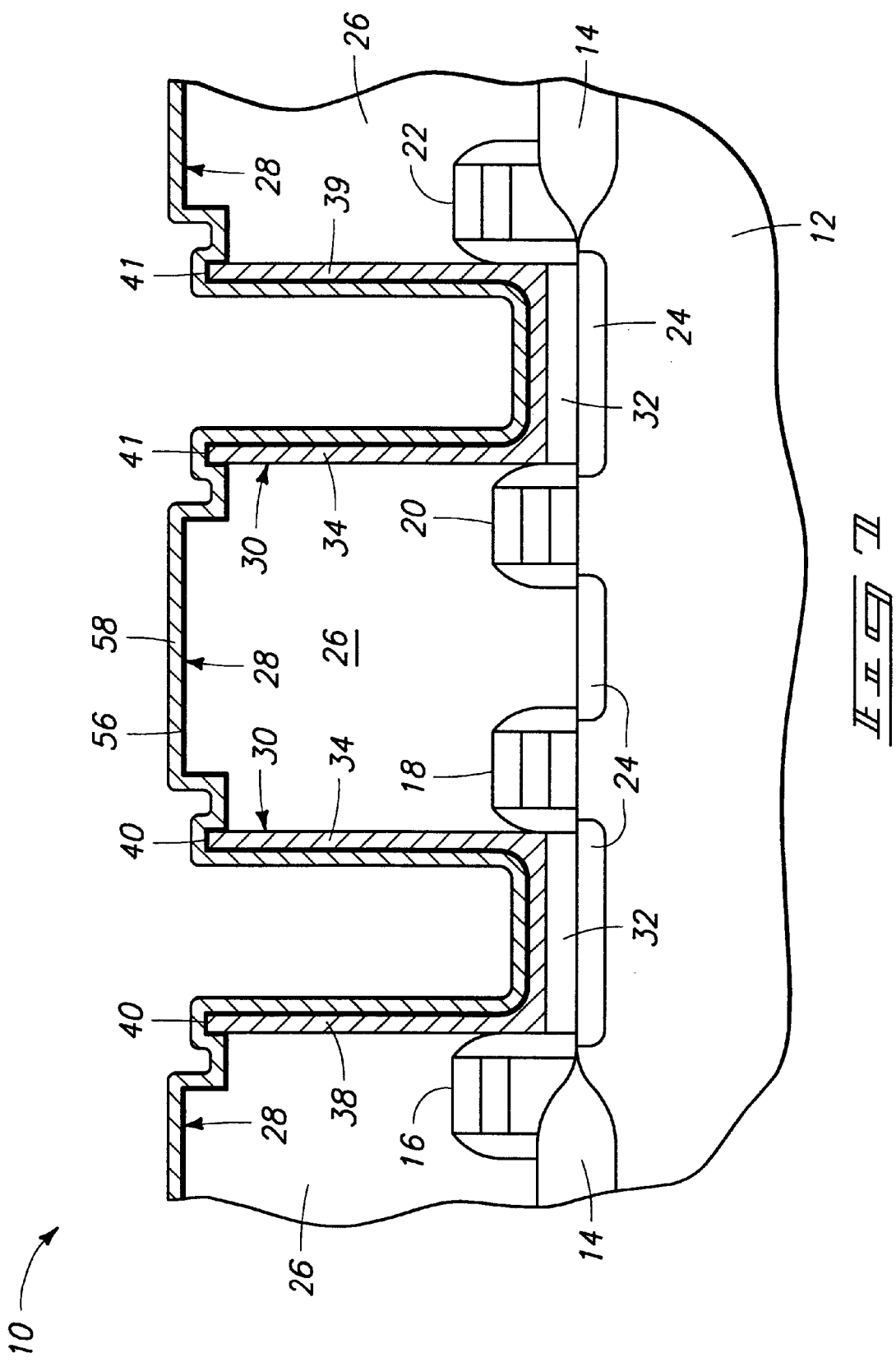
FIG. 7 is a view of the FIG. 1 wafer fragment at a processing step subsequent to that shown by FIG. 5.

Referring to FIG. 7, a capacitor dielectric layer 56 is formed over first container shaped capacitor electrodes 38 and 39. Example and preferred materials in accordance with the preferred embodiments are high k materials, such as barium strontium titanate, $Ta_2O_5$ and lead zirconium titanate, strontium titanate, strontium bismuth titanate and others. In the context of this document, "high k" means a material having a dielectric constant k greater than or equal to 8. Subsequently, a second capacitor electrode layer 58 is formed over capacitor dielectric layer 56 and insulative mass 26 which is common to spaced first capacitor electrodes 38 and 39 within exemplary path 50 (FIG. 6), and in this example will function as the common cell plate layer in DRAM circuitry. Example and preferred materials for layer 58 are the same as those referred to above for layer 34 of first capacitor electrodes 38 and 39. Thus in this example, conductive material in the form of layer 58 is deposited over the substrate and into the capacitor cell plate pattern.

Figure 8:
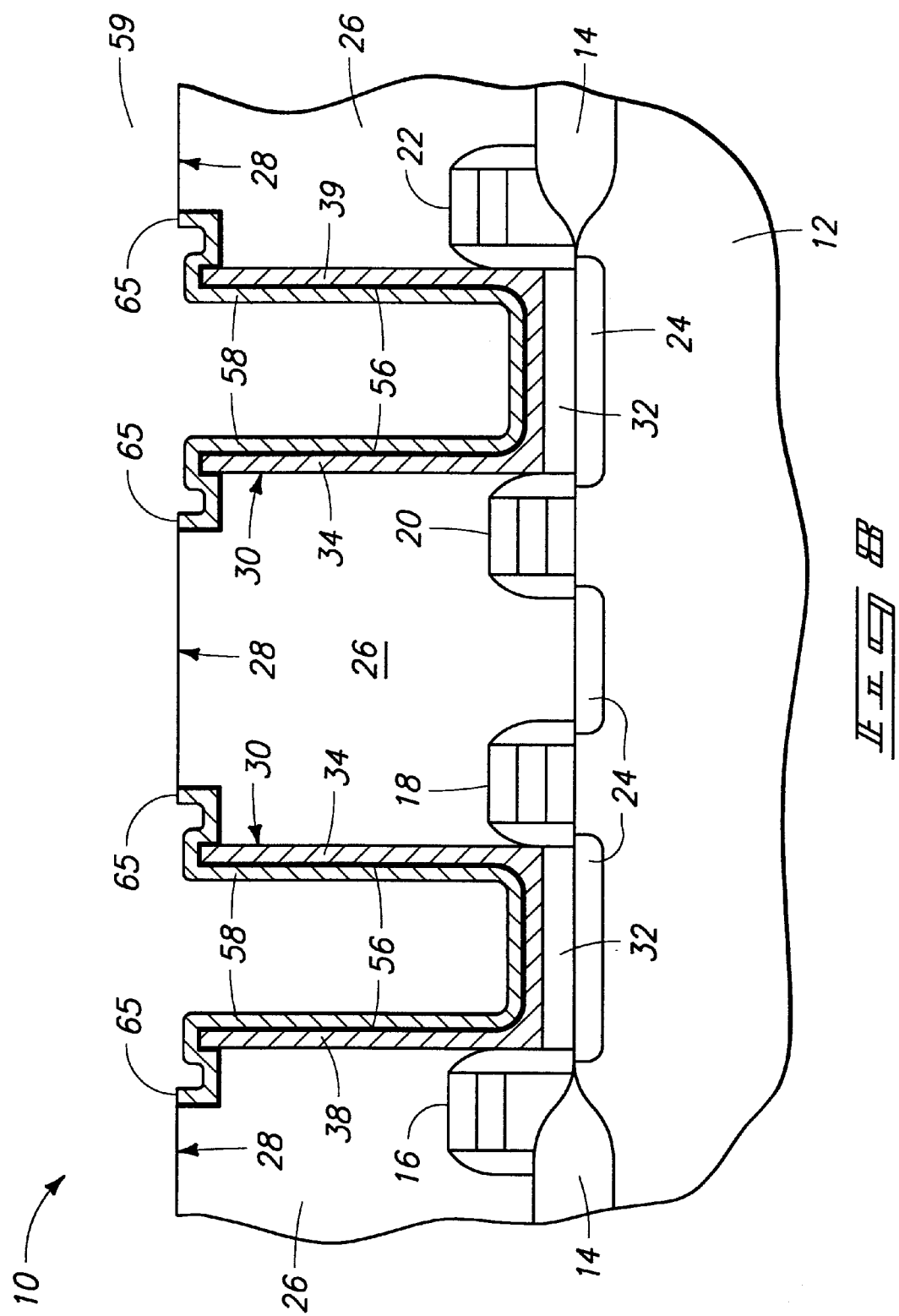
FIG. 8 is a view of the FIG. 1 wafer fragment at a processing step subsequent to that shown by FIG. 7.
Figure 9:
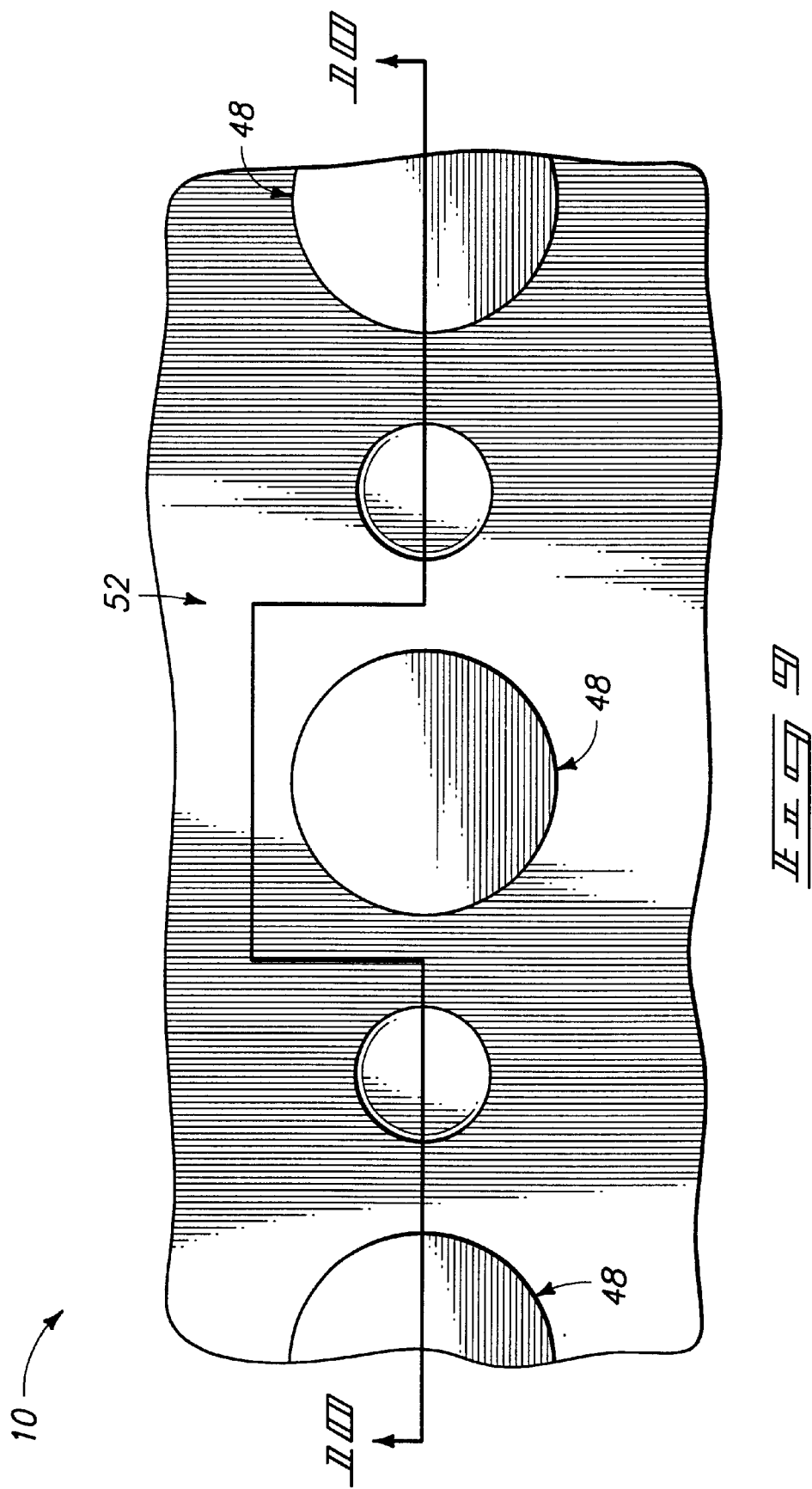
FIG. 9 is a top plan view of a portion of the FIG. 1 wafer fragment as depicted in FIG. 8.
Figure 10:
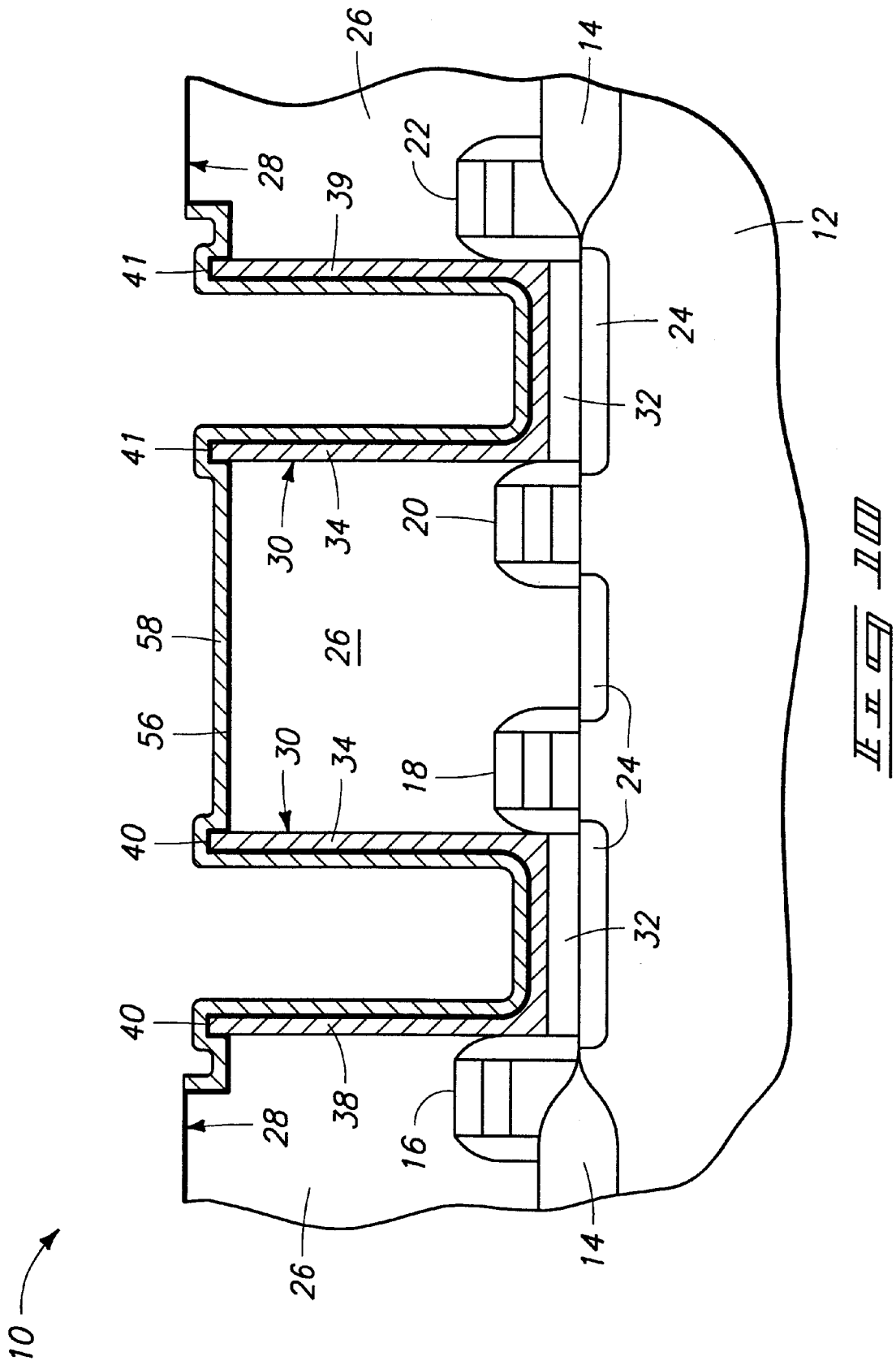
FIG. 10 is a view of the FIG. 8 wafer fragment as would appear through the staggered line cut of line B—B in FIG. 9.

Referring to FIGS. 8, 9 and 10, second capacitor electrode layer 58 and capacitor dielectric layer 56 are polished at least to remaining substantially planar outermost surface 28 of insulating material 26 between spaced container electrodes 38 and 39, thereby providing a region of separation within/through layer 58 between adjacent capacitor structures in the form of bit contact regions 48. Such polishing of the conductive material thereby preferably occurs outwardly of the cell plate pattern previously formed. The polishing is however not to a degree sufficient to lower surface 28 to the same elevation as outer container surfaces 40, 41. This is why the depth of the exemplary recess etch of FIG. 3 is advantageously conducted to be at least as deep as an over etch/over polish margin for the FIG. 8 removal. Thus in the preferred example, such leaves a common second capacitor plate and capacitor dielectric layer over and extending between the two spaced container electrodes 38 and 39 around a portion of insulating material region 48 received between such container electrodes. FIG. 10 is a sectional view taken through staggered line 10—10 in FIG. 9 evidencing such remaining continuous connection of the cell plate layer between the illustrated capacitors, and accordingly throughout the DRAM array in the preferred embodiment. The polishing preferably comprises CMP, for example using an oxidizing slurry at about 20° C. to 80° C.

Figure 11:
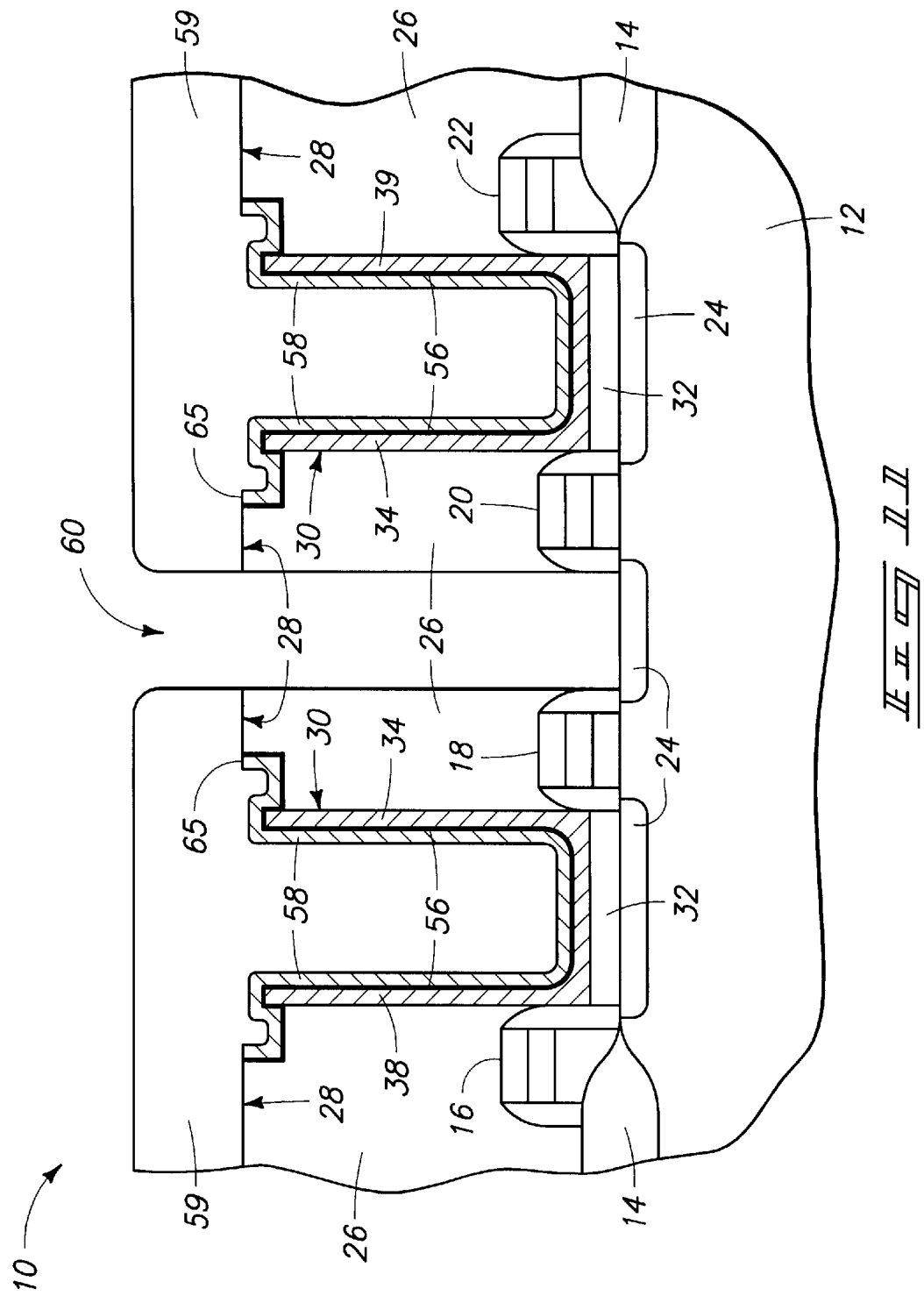
FIG. 11 is a view of the FIG. 1 wafer fragment at a processing step subsequent to that shown by FIG. 8.

Referring to FIG. 11, an insulative layer 59 has been deposited over the substrate, and bit contact openings 60 are formed into layers 59 and 26 between the respective pairs of capacitors (i.e., the capacitors having electrodes 38 and 39) between respective pairs of word lines (i.e., word lines 18 and 20).

Figure 12:
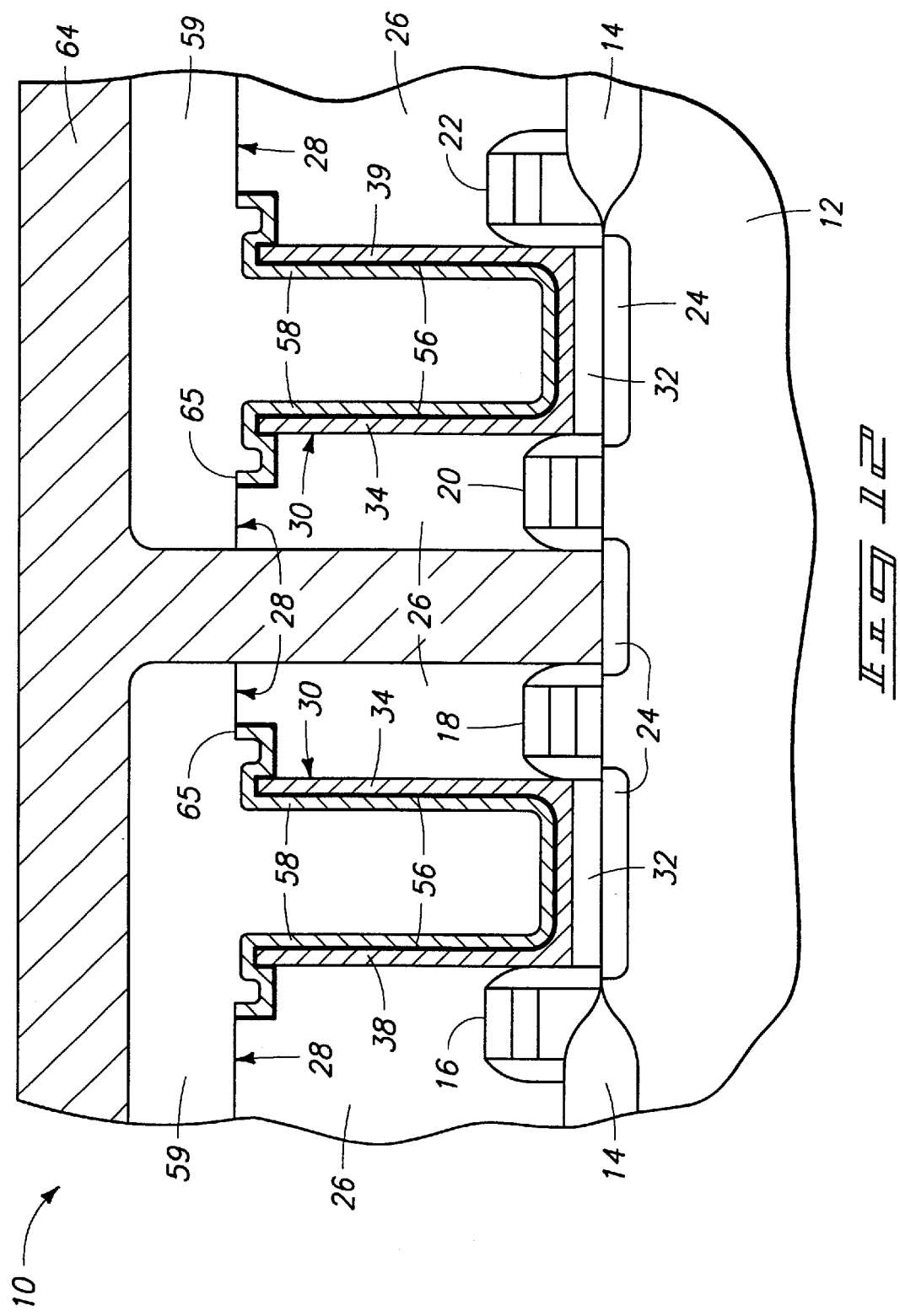
FIG. 12 is a view of the FIG. 1 wafer fragment at a processing step subsequent to that shown by FIG. 11.

Referring to FIG. 12, a suitable conductive material 64 can be provided over the substrate and within contact opening 60. Such can be planarized back, with a subsequent bit line layer being fabricated and patterned into an array of bit lines in electrical connection with the deposited conductive material. Alternately by way of example only, layer 64 can be deposited to be sufficiently thick and then patterned to form an array of bit lines. Such provides but one example process where bit contact openings are formed between pairs of capacitors in a DRAM array fabrication process without ever etching the common cell plate layer between the respective pairs of capacitors. Such further provides an example where at least a portion of the cell plate pattern, here formed relative to insulating mass 26, remains over the substrate in the finished circuitry.

Figure 13:
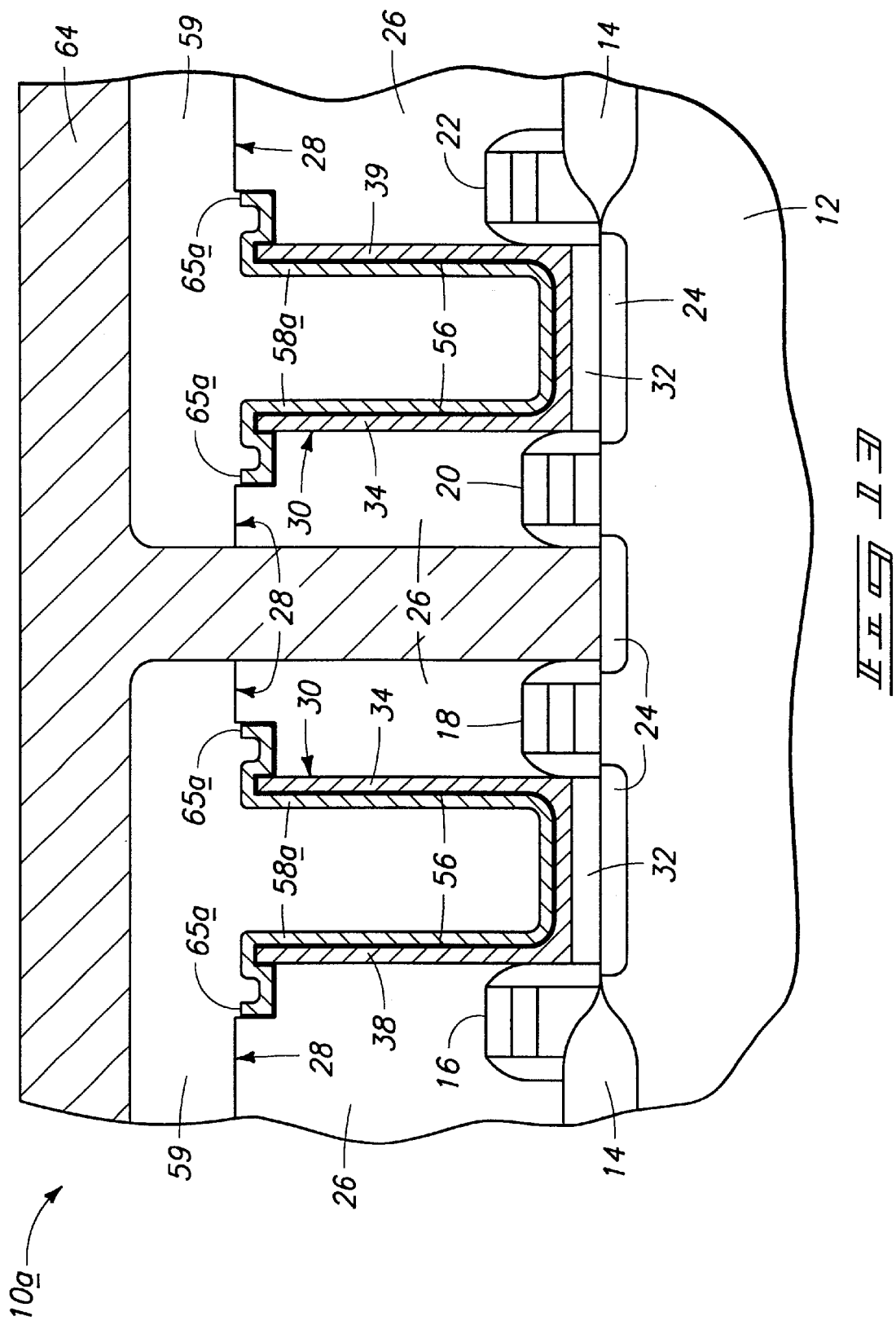
FIG. 13 is a diagrammatic sectional view of an alternate embodiment semiconductor wafer fragment corresponding in process sequence to that depicted by FIG. 12.

The preferred resultant circuitry thereby comprises a pair of adjacent capacitors received within an insulative mass, where the capacitors respectively comprise a first capacitor electrode and a second capacitor electrode common to the pair. The second capacitor electrode has an outermost surface (i.e., surface 65 as depicted in FIGS. 8 and 12) between the first capacitor electrodes (i.e., electrodes 38 and 39) which is elevationally coincident with or elevationally inward of outermost substantially planar surface 28 of insulative mass 26 extending at least partially between the adjacent capacitors. FIGS. 8 and 12 depict an example wherein outermost surfaces 65 are elevationally coincident with surface 28. FIG. 13 depicts an example fragment 10a whereby outermost surfaces 65a are received elevationally inward of surface 28.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising a pair of adjacent capacitors received within an insulative mass, the insulative mass having an outermost substantially planar surface extending at least partially between the adjacent capacitors, the capacitors respectively comprising an inner first capacitor electrode, the capacitors respectively comprising an outer second capacitor electrode common to the pair, the second capacitor electrode having an outermost surface between the first capacitor electrodes which is elevationally inward of the outermost substantially planar surface of the insulative mass.

2. The integrated circuitry of claim 1 wherein the first electrode comprises a material which is, and the second electrode comprises a material which is, selected from the group consisting of Pt; Rh; Ru; Ir; conductive oxides of Pt, Rh, Ru, Ir; and mixtures thereof.

3. The integrated circuitry of claim 1 wherein the first electrodes are container shaped.

4. DRAM circuitry comprising:

an array of DRAM word lines;

an insulative mass received over the DRAM word lines, the insulative mass having an outermost substantially planar surface within the array;

an array of DRAM capacitors at least partially received within the insulative mass, the DRAM capacitors comprising respective inner storage nodes and comprising an outer capacitor cell electrode common to a plurality of capacitors of the array, the cell electrode having an outermost surface which is elevationally inward of the outermost substantially planar surface of the insulative mass within the array.

5. The DRAM circuitry of claim 4 wherein the storage nodes comprise a material which is, and the cell electrode comprises a material which is, selected from the group consisting of Pt; Rh; Ru; Ir; conductive oxides of Pt, Rh, Ru, Ir; and mixtures thereof.

6. The DRAM circuitry of claim 4 wherein the storage nodes are container shaped.

* * * * *

UNITED STATES PATENT AND TRADEMARK OFFICE
CERTIFICATE OF CORRECTION

PATENT NO. : 6,570,204 B1
DATED : May 27, 2003
INVENTOR(S) : Vishnu K. Agarwal

It is certified that error appears in the above-identified patent and that said Letters Patent is hereby corrected as shown below:

<u>Column 4,</u>
Line 9, replace "polysilicon plugs 32 possibility having been fabricated prior" with
-- polysilicon plugs 32 possibly having been fabricated prior --

<u>Column 5,</u>
Line 13, replace "example, $CHF_3$ or $CF_4$ gas mixtures in plasma typically use"
with -- example, $CHF_3$ or $CF_4$ gas mixtures in plasma typically used --
Line 26, replace "with in this example the pattern being formed in insulative"
with -- within this example the pattern being formed in insulative --

Signed and Sealed this

Twenty-ninth Day of July, 2003

JAMES E. ROGAN
*Director of the United States Patent and Trademark Office*